United States Patent
Takahashi

(10) Patent No.: US 9,543,422 B1
(45) Date of Patent: Jan. 10, 2017

(54) SEMICONDUCTOR DEVICE

(71) Applicant: KABUSHIKI KAISHA TOSHIBA, Tokyo (JP)

(72) Inventor: Hitoshi Takahashi, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/060,469

(22) Filed: Mar. 3, 2016

(30) Foreign Application Priority Data

Aug. 27, 2015 (JP) .................................. 2015-167612

(51) Int. Cl.
| | | |
|---|---|---|
| *H01L 29/739* | (2006.01) | |
| *H01L 29/423* | (2006.01) | |
| *H01L 29/417* | (2006.01) | |
| *H01L 29/40* | (2006.01) | |
| *H01L 29/08* | (2006.01) | |
| *H01L 29/10* | (2006.01) | |
| *H01L 29/06* | (2006.01) | |
| *H01L 29/78* | (2006.01) | |

(52) U.S. Cl.
CPC ....... *H01L 29/7397* (2013.01); *H01L 29/0696* (2013.01); *H01L 29/0804* (2013.01); *H01L 29/0821* (2013.01); *H01L 29/1095* (2013.01); *H01L 29/407* (2013.01); *H01L 29/41708* (2013.01); *H01L 29/4236* (2013.01); *H01L 29/7396* (2013.01); *H01L 29/7811* (2013.01); *H01L 29/7813* (2013.01)

(58) Field of Classification Search
CPC .......................... H01L 29/7396; H01L 29/407
See application file for complete search history.

(56) References Cited

U.S. PATENT DOCUMENTS

| | | | |
|---|---|---|---|
| 5,298,769 A | 3/1994 | Omura et al. | |
| 7,319,257 B2 | 1/2008 | Yamaguchi et al. | |
| 8,550,968 B2 | 10/2013 | Sugimura et al. | |
| 2010/0039844 A1 | 2/2010 | Arai et al. | |
| 2014/0339600 A1 | 11/2014 | Yoshikawa | |

OTHER PUBLICATIONS

Taiwanese Office Action dated Sep. 2, 2016, filed in Taiwan counterpart Patent Application No. 105107365, 6 pages (with English translation).

*Primary Examiner* — Amar Movva
(74) *Attorney, Agent, or Firm* — Patterson & Sheridan, LLP

(57) ABSTRACT

A semiconductor device includes a second region of a second conductivity type above a first region of a first conductivity type. A gate electrode has a portion surrounded by the second region via a gate insulating layer. A first electrode, which is separated from the gate electrode, has a portion surrounded by the second region via a first insulating layer. A third region of a second conductivity type is between the first insulating layer and the gate insulating layer. The third region contacts the first insulating layer and has a second conductivity type carrier concentration higher than the second region. A fourth region has a portion aligned with the third region along a first direction. A fifth region of the second conductivity type contacts the gate insulating layer and is aligned with the first portion along a second direction perpendicular to the first direction.

18 Claims, 5 Drawing Sheets

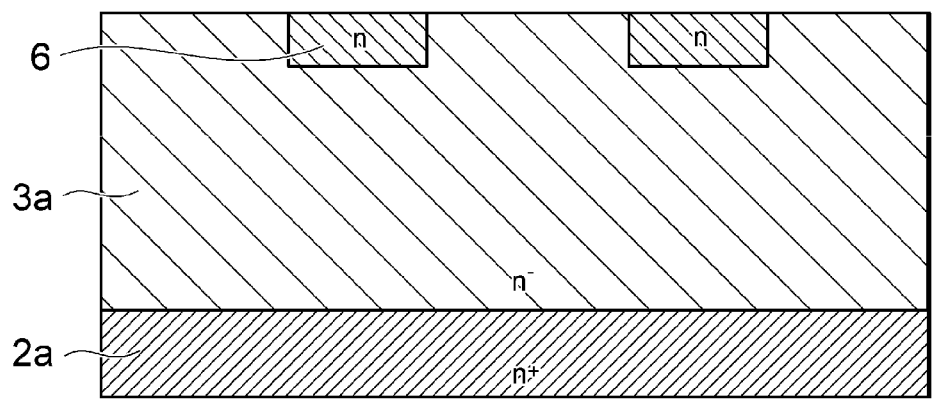
FIG. 2A
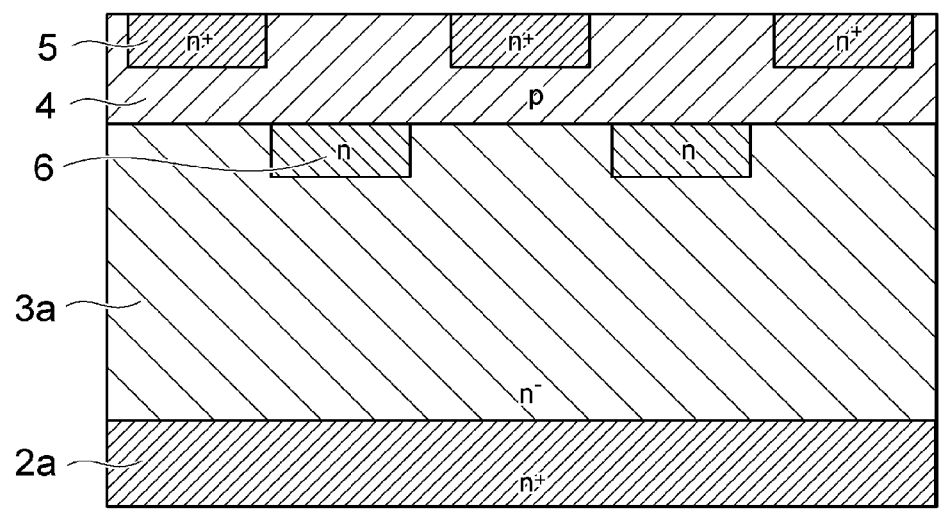
FIG. 2B
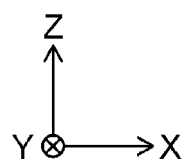

SEMICONDUCTOR DEVICE

CROSS-REFERENCE TO RELATED APPLICATION

This application is based upon and claims the benefit of priority from Japanese Patent Application No. 2015-167612, filed on Aug. 27, 2015, the entire contents of which are incorporated herein by reference.

FIELD

Embodiments described herein relate generally to a semiconductor device.

BACKGROUND

A semiconductor device such as an insulated gate bipolar transistor (IGBT) includes a structure in which an emitter region is reduced to suppress latch-up of a parasitic bipolar transistor.

However, as the emitter region is reduced, density of a channel is decreased, and thus an ON voltage in the device increases.

DESCRIPTION OF THE DRAWINGS

FIGS. 2A and 2B depict fabrication processes of the semiconductor device according to the first embodiment.

DETAILED DESCRIPTION

Figure 1:
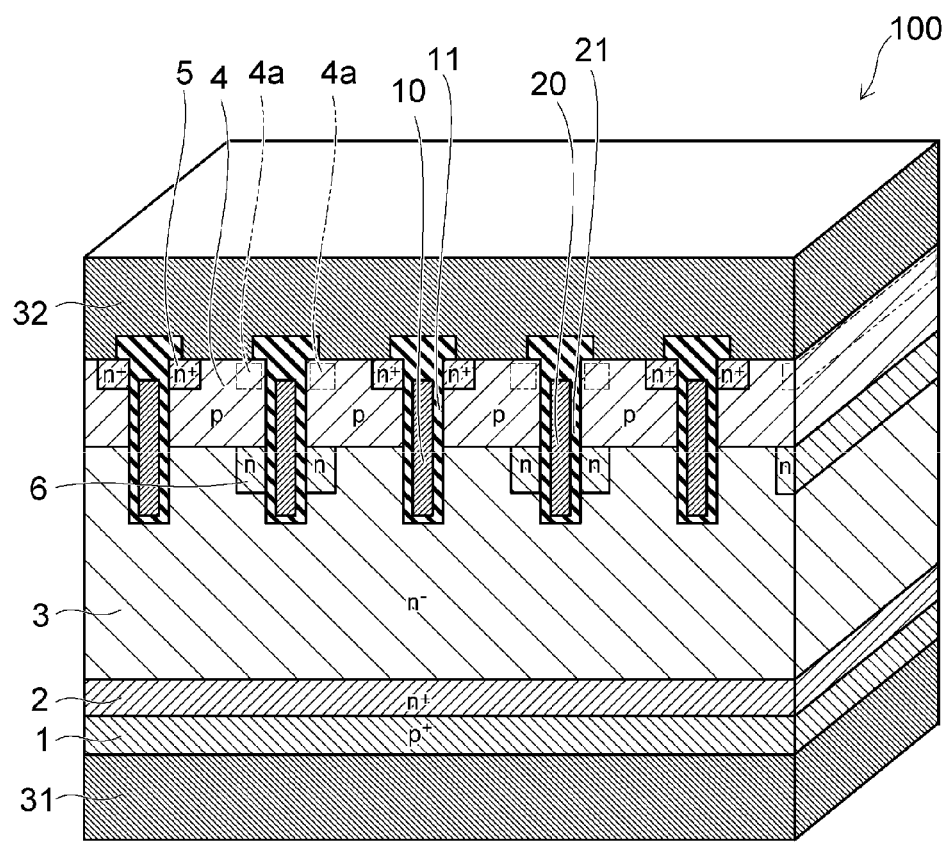
FIG. 1 depicts a part of a semiconductor device according to a first embodiment.
Figure 1:
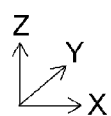

An example embodiment provides a semiconductor device which can suppress an increase of an ON voltage.

In general, according to one embodiment, a semiconductor device includes; a first semiconductor region of a first conductivity type, a second semiconductor region of a second conductivity type, a third semiconductor region of the second conductivity type, a fourth semiconductor region of the first conductivity type, a fifth semiconductor region of the second conductivity type, a gate electrode, and a first electrode.

The second semiconductor region is provided above the first semiconductor region.

The gate electrode includes a portion that is surrounded by the second semiconductor region via a gate insulating layer.

The first electrode is separated from the gate electrode. The first electrode includes a portion surrounded by the second semiconductor region via a first insulating layer. The third semiconductor region is provided in a portion of the second semiconductor region between the first insulating layer and the gate insulating layer.

The third semiconductor region is in contact with the first insulating layer. A concentration of carriers of a second conductivity type in the third semiconductor region is higher than a concentration of carriers of a second conductivity type in the second semiconductor region.

The fourth semiconductor region includes a first portion aligned along a first direction with the third semiconductor region. The fourth semiconductor region is provided on the second semiconductor region and the third semiconductor region. The fourth semiconductor region is provided between the gate electrode and the first electrode.

The fifth semiconductor region is provided in the fourth semiconductor region. The fifth semiconductor region is in contact with the gate insulating layer. The fifth semiconductor region is aligned along a second direction with the first portion, the second direction being perpendicular to the first direction.

Hereinafter, example embodiments of the present disclosure will be described with reference to the accompanying drawings.

The drawings are schematic and conceptual. In the drawings, a relationship between a thickness and a width of each portion, a size ratio between the portions, or the like is not necessarily the same as that of an actual one. In addition, even if the same portions are illustrated in different drawings, dimensions and ratios may be illustrated differently from each other in the different drawings.

In addition, in the present disclosure, the same symbols or reference numerals are attached to the same elements as described previously, and detailed description thereof will be appropriately omitted.

In the description of each embodiment, an XYZ orthogonal coordinate system is used. A direction toward an $n^-$-type semiconductor region 3 from a $p^+$-type collector region 1 is referred to as a Z-direction (first direction), and two directions which are perpendicular to the Z-direction and are orthogonal to each other are referred to as an X-direction and a Y-direction.

In the following description, notation of $n^+$, n, $n^-$, $p^+$, and p represents the relative level of impurity concentration of each conductivity type. That is, $n^+$ indicates that the impurity concentration of an n type thereof is relatively higher than that of n, and $n^-$ indicates that the impurity concentration of an n type thereof is relatively lower than that of n. In addition, $p^+$ indicates that the impurity concentration of a p type thereof is relatively higher than that of p.

In example embodiments described below, the embodiments may also be implemented with the p type and n type of each semiconductor region being reversed from that specifically described in the examples.

First Embodiment

Referring to FIG. 1, an example of a semiconductor device according to a first embodiment will be described.

FIG. 1 is a perspective sectional view illustrating a part of a semiconductor device 100 according to a first embodiment.

The semiconductor device 100 is, for example, an IGBT.

As illustrated in FIG. 1, the semiconductor device 100 includes a $p^+$-type (first conductivity type) collector region 1 (first semiconductor region), an $n^+$-type (second conductivity type) semiconductor region 2, an $n^-$-type semiconductor region 3 (second semiconductor region), a p-type base region 4 (fourth semiconductor region), an $n^+$-type emitter region 5 (fifth semiconductor region), an n-type semiconductor region 6 (third semiconductor region), a gate electrode 10, a gate insulating layer 11, a first electrode 20, a first insulating layer 21, a collector electrode 31, an emitter electrode 32.

The collector electrode 31 is provided on a lower surface of the semiconductor device 100.

The p+-type collector region 1 is provided on the collector electrode 31, and is electrically connected to the collector electrode 31.

The n+-type semiconductor region 2 is provided on the p+-type collector region 1.

The n−-type semiconductor region 3 is provided on the n+-type semiconductor region 2 above the p+-type collector region 1.

The p-type base region 4 is provided on the n−-type semiconductor region 3.

The n+-type emitter region 5 is selectively provided on the p-type base region 4.

The gate electrode 10 and the first electrode 20 are provided on the n−-type semiconductor region 3 in a state of being separated from each other. The gate electrode 10 and the first electrode 20 are both arranged along the X-direction.

The gate electrode 10 faces the p-type base region 4 through the gate insulating layer 11 in the X-direction. The first electrode 20 faces the p-type base region 4 through the first insulating layer 21 in the X-direction. In addition, the gate electrode 10 and the first electrode 20 include portions surrounded by the n−-type semiconductor region 3 along an X-Y surface.

The n-type semiconductor region 6 is provided in a portion of the n− type semiconductor region 3 between the gate insulating layer 11 and the first insulating layer 21. In addition, the n-type semiconductor region 6 is provided between the p-type base region 4 and the n−-type semiconductor region 3 in the Z-direction, and is in contact with the first insulating layer 21. The n-type semiconductor region 6 may be in contact with the p-type base region 4, and another portion of the n−-type semiconductor region 3 may be provided between the n-type semiconductor region 6 and the p-type base region 4.

The p-type base region 4 includes a first portion 4a in parallel with the n-type semiconductor region 6 in the X-direction and aligned along the X-direction with the n-type semiconductor region 6. The first portion 4a is in contact with the first insulating layer 21. In addition, the first portion 4a is in parallel with the n+-type emitter region 5 in the X-direction and aligned along the X-direction with the n+-type emitter region 5.

In other words, the n+-type emitter region 5 is provided on the gate electrode 10 side only between the gate electrode 10 and the first electrode 20, and the n-type semiconductor region 6 is provided on the first electrode 20 side only. The n+-type emitter region 5 and the n-type semiconductor region 6 are not aligned with each other in the Z-direction.

The p-type base region 4, the n+-type emitter region 5, the n-type semiconductor region 6, the gate electrode 10, and the first electrode 20 are repeated in the X-direction, and respectively extend in the Y-direction.

The emitter electrode 32 is provided on an upper surface of the semiconductor device 100, and is electrically connected to the p-type base region 4 and the n+-type emitter region 5. In addition, an insulating layer is provided between the gate electrode 10 and the emitter electrode 32, and the gate electrode 10 and the emitter electrode 32 are electrically disconnected from each other.

The first electrode 20 may be electrically connected to the emitter electrode 32. Alternatively, the first electrode 20 may be electrically connected to the gate electrode 10.

In a state in which a positive voltage is applied to the collector electrode 31 with respect to the emitter electrode 32, if a voltage higher than or equal to a threshold is applied to the gate electrode 10, an IGBT is turned on. At this time, a channel (inversion layer) is formed in a region near the gate insulating layer 11 of the p-type base region 4.

Subsequently, an example of a fabrication method of the semiconductor device 100 according to the first embodiment will be described with reference to FIGS. 2A and 2B, and FIGS. 3A and 3B.

FIGS. 2A and 2B and FIGS. 3A and 3B are process sectional views illustrating fabrication processes of the semiconductor device 100 according to the first embodiment.

First, a semiconductor substrate in which an n−-type semiconductor layer 3a is formed on an n+-type semiconductor layer 2a is prepared. Subsequently, as illustrated in FIG. 2A, ion injection of an n-type impurity is selectively performed onto a surface of the n−-type semiconductor layer 3a, whereby the n-type semiconductor region 6 is formed.

Subsequently, an n−-type semiconductor layer 3b (not illustrated) is formed on the n−-type semiconductor layer 3a and the n-type semiconductor region 6. As ion injection of p-type impurity is performed onto the n−-type semiconductor layer 3b, the p-type base region 4 is formed, as illustrated in FIG. 2B. Subsequently, ion injection of n-type impurity is selectively performed onto a surface of the p-type base region 4, whereby the n+-type emitter region 5 is formed as illustrated in FIG. 2B.

Figure 3A:
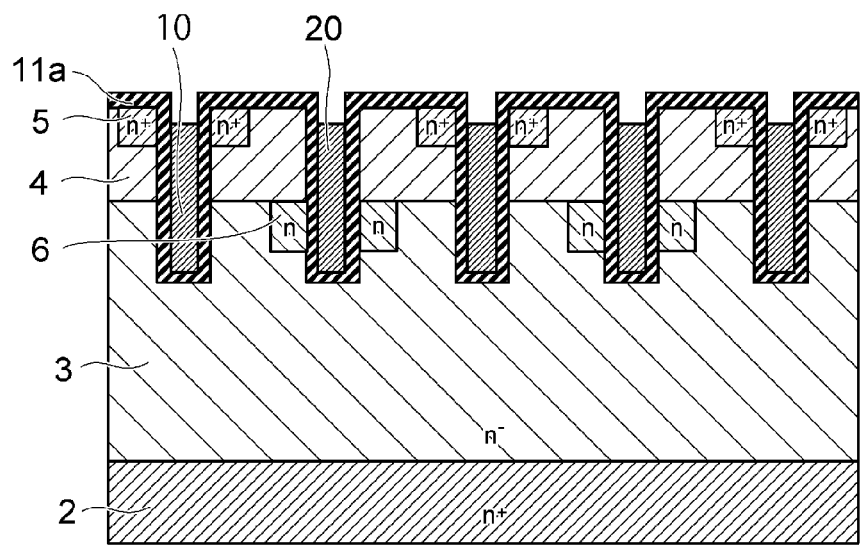
FIGS. 3A and 3B depict additional fabrication processes of the semiconductor device according to the first embodiment.

Subsequently, as illustrated in FIG. 3A, a plurality of trenches which pass through the p-type base region 4 are formed. A portion of the trenches passes through the n+-type emitter region 5, and the other portion of the trenches passes through the n-type semiconductor region 6. Subsequently, an inner wall of the trench is thermally oxidized, whereby an insulating layer 11a is formed. A conductive layer is formed on the insulating layer 11a, and etchback of the conductive layer is performed as illustrated in FIG. 3A. Through these processes, the gate electrode 10 or the first electrode 20 are formed inside each trench.

Figure 3B:
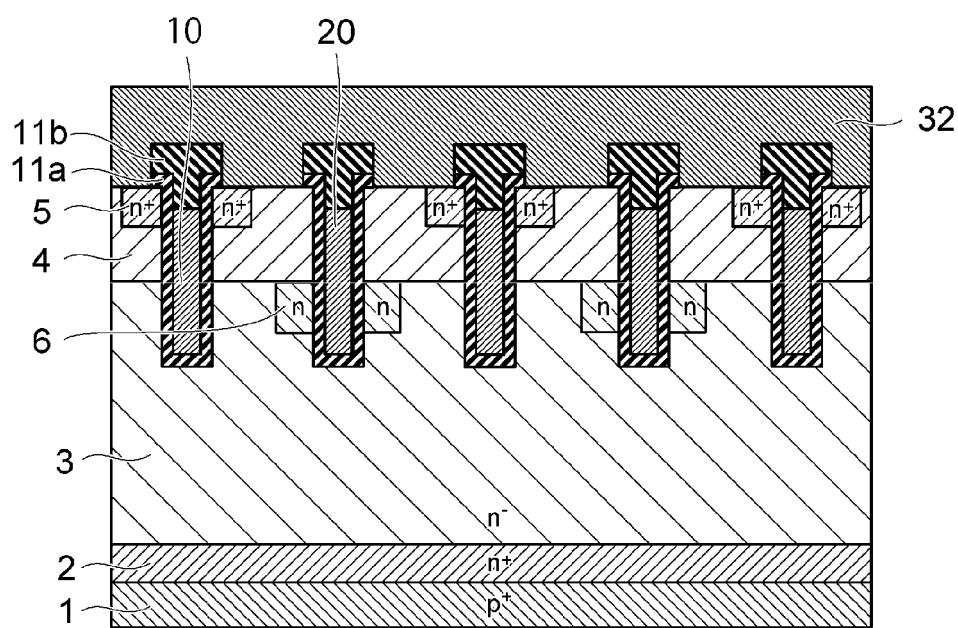
Figure 3B:
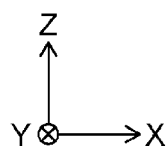

Subsequently, as illustrated in FIG. 3B, an insulating layer 11b which covers the electrode and the p-type base region 4 is formed. By patterning the insulating layer 11a and the insulating layer 11b, the gate insulating layer 11 and the first insulating layer 21 are formed. Subsequently, a metal layer is formed on the insulating layers and the metal layer is patterning, and thereby the emitter electrode 32 is formed.

Subsequently, a rear side of the n+-type semiconductor layer 2a is ground until the n+-type semiconductor layer 2a is thinned to a predetermined thickness. Subsequently, as illustrated in FIG. 3B, ion injection of a p-type impurity is performed onto a bottom surface of the n+-type semiconductor layer 2a, whereby the p+-type collector region 1 is formed.

Thereafter, the collector electrode 31 is formed beneath the p+-type collector region 1, and thus the semiconductor device 100 illustrated in FIG. 1 is fabricated.

Here, operation and effect of the present embodiment will be described.

The semiconductor device 100 according to the present embodiment includes the n+-type emitter region 5 which is provided on the gate electrode 10 side, and the n-type semiconductor region 6 which is provided on the first electrode 20 side.

As the n+-type emitter region 5 is provided on the gate electrode 10 side, a current flowing through each p-type base region 4 decreases, and latch-up of a parasitic bipolar transistor is suppressed.

At this time, since the n$^+$-type emitter region 5 is not provided on the first electrode 20 side, channel density decreases, and an ON voltage of the semiconductor device increases.

Meanwhile, as the n-type semiconductor region 6 is provided, holes can be accumulated in the n-type semiconductor region 6. At this time, as the n-type semiconductor region 6 is provided on the first electrode 20 side, it is possible to reduce recombination of electrons flowing through the n$^-$-type semiconductor region 3 through the channel, and the holes accumulated in the n-type semiconductor region 6. As the recombination of the electrons and the holes is reduced, it is possible to increase density of carriers in the n$^-$-type semiconductor region 3, and to decrease the ON voltage of the semiconductor device.

That is, according to the present embodiment, it is possible to suppress an increase of the ON voltage being generated by providing the n$^+$-type emitter region 5 in the gate electrode 10 side and providing the n-type semiconductor region 6 on the first electrode 20 side.

Second Embodiment

An example of a semiconductor device according to a second embodiment will be described with reference to FIG. 4.

Figure 4:
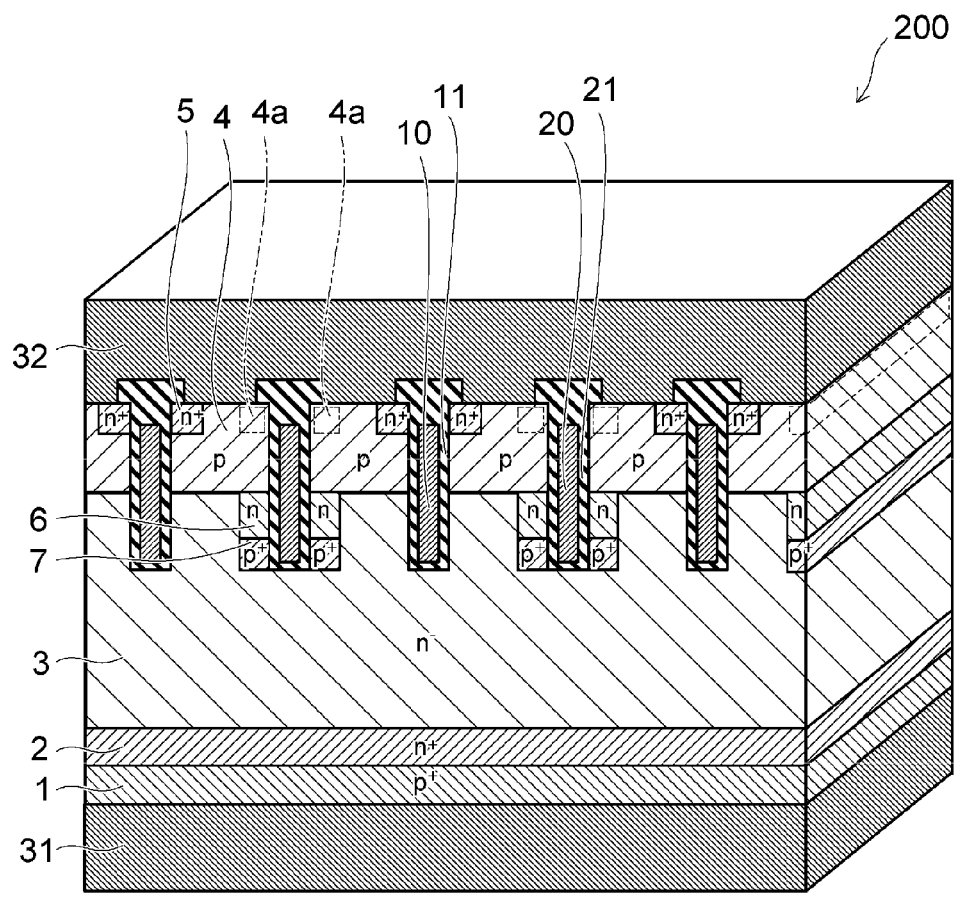
FIG. 4 depicts a part of a semiconductor device according to a second embodiment.
Figure 4:
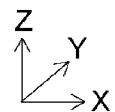

FIG. 4 is a perspective sectional view illustrating a part of a semiconductor device 200 according to a second embodiment.

The semiconductor device 200 according to the second embodiment is different from the semiconductor device 100 in that the semiconductor device 200 further includes a p$^+$-type semiconductor region 7. In addition, in the semiconductor device 200, the first electrode 20 is electrically connected to the gate electrode 10.

The p$^+$-type semiconductor region 7 is provided between the n-type semiconductor region 6 and the n$^+$-type semiconductor region 2, in the Z-direction. The n-type semiconductor region 6 is provided between the p-type base region 4 and the p$^+$-type semiconductor region 7, and is in contact with the n$^-$-type semiconductor region 3.

In the semiconductor device 200, when a positive voltage higher than or equal to a threshold is applied to the gate electrode 10 and the first electrode 20, a MOSFET is turned on. However, the n$^+$-type emitter region 5 is provided only on the gate electrode 10 side. For this reason, if a positive voltage higher than or equal to a threshold is applied to the first electrode 20, a channel is formed near the first insulating layer 21, but electrons do not flow through the channel.

After the MOSFET is turned on, a negative voltage is applied to the gate electrode 10 and the first electrode 20. By this operation, a channel with respect to holes is formed in a region near the first insulating layer 21 of the n-type semiconductor region 6 which faces the first electrode 20. The holes accumulated in the n$^-$-type semiconductor region 3 are discharged to the emitter electrode 32 through the channel.

According to the present embodiment, it is possible to efficiently discharge the carriers when the MOSFET is turned on. For this reason, according to the present embodiment, it is possible to reduce switching loss of the semiconductor device, in addition to the effects described in the first embodiment.

In addition, by providing the p$^+$-type semiconductor region 7, it is possible to reduce resistance with regard to the holes in the discharging path, when the holes are discharged through the channel which is formed in the n-type semiconductor region 6. For this reason, it is possible to further reduce the switching loss of the semiconductor device.

Modification Example

Figure 5:
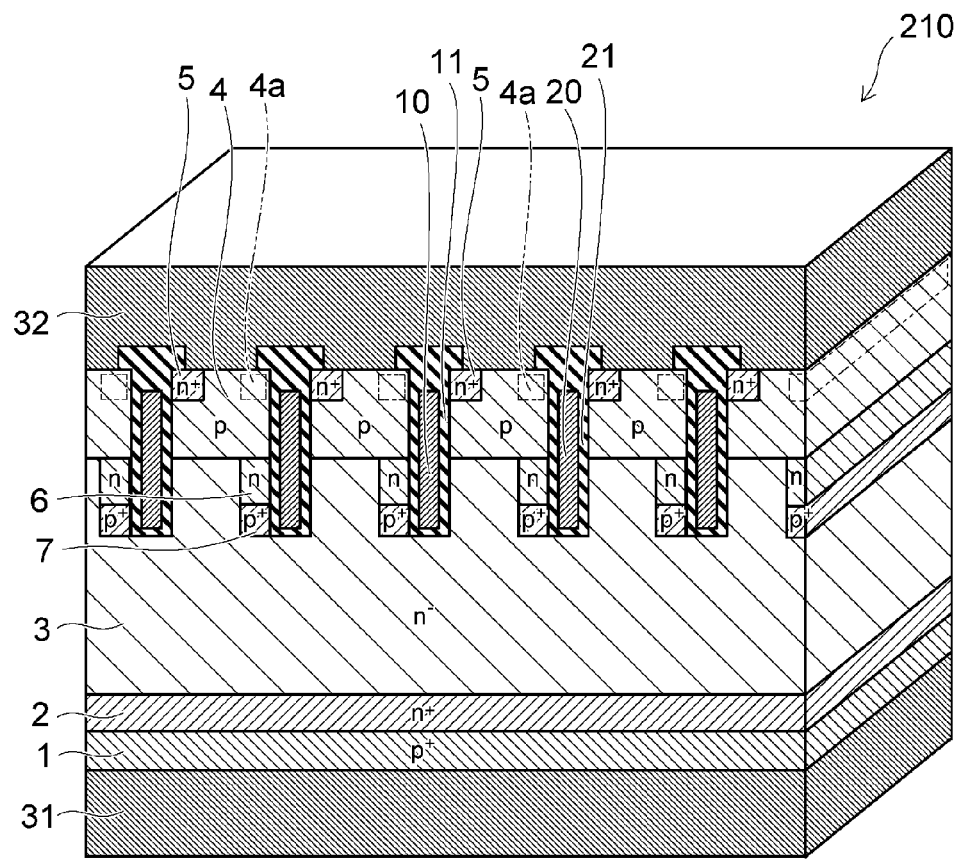
FIG. 5 depicts a part of a semiconductor device according to a modification example of the second embodiment.
Figure 5:
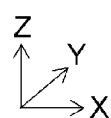

FIG. 5 is a perspective sectional view illustrating a part of a semiconductor device 210 according to a modification example of the second embodiment.

In the semiconductor device 200, two first portions 4a and two n$^+$-type emitter regions 5 are alternately provided in the X-direction. In the semiconductor device 210 according to the modification example, the first portion 4a and the n$^+$-type emitter region 5 are alternately provided in the X-direction.

In the modification example, a channel with respect to holes is also formed in the n-type semiconductor region 6 by applying a negative voltage to the gate electrode 10 and the first electrode 20. Thus, according to the modification example, it is possible to reduce switching loss of a semiconductor device, in the same manner as in the second embodiment.

In each embodiment described above, it is possible to confirm a relative level of impurity concentration between the respective semiconductor regions, using, for example, a scanning capacitance microscope (SCM). A concentration of carriers in each semiconductor region can be regarded as being equal to impurity concentration which is activated in each semiconductor region. Thus, it is also possible to confirm a relative level of the concentration of carriers between the respective regions, using the SCM.

In addition, it is also possible to measure the impurity concentration in each semiconductor region, using, for example, a secondary ion mass spectrometry (SIMS).

As described above, certain embodiments of the invention are described, but the embodiments are provided as examples, and are not intended to limit the scope of the invention. Such embodiments may comprise other various forms, and various omissions, replacements, or modifications can be made without departing from the gist of the present disclosure. It is possible for those skilled in the art to appropriately select various configurations of each element, which are included in the present embodiment, from the known technology. These selections or modifications are included in the scope of the present disclosure, and are included in the scope set forth in the appended claims and their equivalents. In addition, embodiments described above may be combined with the other embodiments described above and these combinations are included in the scope of the present disclosure.

While certain embodiments have been described, these embodiments have been presented by way of example only, and are not intended to limit scope. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:
1. A semiconductor device, comprising:
a first semiconductor region of a first conductivity type;
a second semiconductor region of a second conductivity type that is provided above the first semiconductor region;

a gate electrode including a portion that is surrounded by the second semiconductor region via a gate insulating layer;

a first electrode that includes a portion surrounded by the second semiconductor region via a first insulating layer, the first electrode being separated from the gate electrode;

a third semiconductor region of the second conductivity type that is provided in a portion of the second semiconductor region between the first insulating layer and the gate insulating layer, the third semiconductor region contacting the first insulating layer and having a concentration of carriers of the second conductivity type that is higher than a concentration of carriers of the second conductivity type in the second semiconductor region;

a fourth semiconductor region of the first conductivity type that includes a first portion aligned along a first direction with the third semiconductor region and is provided on the second semiconductor region and the third semiconductor region and between the gate electrode and the first electrode; and a fifth semiconductor region of the second conductivity type that is provided in the fourth semiconductor region, the fifth semiconductor region contacting the gate insulating layer and aligned along a second direction with the first portion, the second direction being perpendicular to the first direction.

2. The device according to claim 1, wherein the first electrode is electrically connected to the gate electrode.

3. The device according to claim 2, further comprising:
a sixth semiconductor region of the first conductivity type that is provided between a portion of the second semiconductor region and the third semiconductor region in the first direction.

4. The device according to claim 3, wherein the first electrode and the sixth semiconductor region are in parallel with each other in the second direction.

5. The device according to claim 3, wherein the third semiconductor region and the fourth semiconductor region are not in parallel with each other in the first direction.

6. The device according to claim 3, wherein the sixth semiconductor region is in contact with the first insulating layer.

7. The device according to claim 6, wherein the sixth semiconductor region is separated from the fourth semiconductor region.

8. The device according to claim 1, wherein the fifth semiconductor region has a concentration of carriers of the second conductivity type that is higher than a concentration of carriers of the second conductivity type in the third semiconductor region.

9. The device of claim 1, further comprising an emitter electrode provided on the fourth semiconductor region and the fifth semiconductor region.

10. The device according to claim 9, wherein the first electrode is electrically connected to the gate electrode and further comprising a sixth semiconductor region of the second conductivity type that is provided between a portion of the second semiconductor region and the third semiconductor region in the first direction.

11. A semiconductor device, comprising:
a first semiconductor region of a first conductivity type p;

a second semiconductor region of a second conductivity type that is provided above the first semiconductor region;

a gate electrode including a portion that is surrounded by the second semiconductor region via a gate insulating layer;

a first electrode that includes a portion surrounded by the second semiconductor region via a first insulating layer, the first electrode being separated from the gate electrode;

a third semiconductor region of the second conductivity type that is provided in a portion of the second semiconductor region between the first insulating layer and the gate insulating layer, the third semiconductor region contacting the first insulating layer and having a concentration of carriers of the second conductivity type that is higher than a concentration of carriers of the second conductivity type in the second semiconductor region;

a fourth semiconductor region of the first conductivity type that includes a first portion aligned along a first direction with the third semiconductor region and is provided on the second semiconductor region and the third semiconductor region and between the gate electrode and the first electrode;

a fifth semiconductor region of the second conductivity type that is provided in the fourth semiconductor region, the fifth semiconductor region contacting the gate insulating layer and aligned along a second direction with the first portion, the second direction being perpendicular to the first direction; and a sixth semiconductor region of the first conductivity type that is provided between a portion of the second semiconductor region and the third semiconductor region in the first direction.

12. The device according to claim 11, wherein the fifth semiconductor region is provided alternately with the first portion along the second direction.

13. The device according to claim 12, wherein the fifth semiconductor region is not aligned with the third semiconductor region in the first direction.

14. The device according to claim 11, wherein the sixth semiconductor region is separated from the fourth semiconductor region.

15. The device according to claim 14, further comprising an emitter electrode provided on the fourth semiconductor region and the fifth semiconductor region, and wherein the first electrode is electrically connected to the gate electrode.

16. The device according to claim 15, wherein the fifth semiconductor region has a concentration of carriers of the second conductivity type that is higher than a concentration of carriers of the second conductivity type in the third semiconductor region.

17. The device according to claim 16, wherein the sixth semiconductor region is in contact with the first insulating layer.

18. The device according to claim 11, further comprising an emitter electrode provided on the fourth semiconductor region and the fifth semiconductor region, and wherein the fifth semiconductor region is provided alternately with the first portion along the second direction, and the fifth semiconductor region is not aligned with the third semiconductor region in the first direction.

* * * * *